United States Patent
Ronen

(10) Patent No.: US 8,212,367 B2
(45) Date of Patent: Jul. 3, 2012

(54) INTEGRATED CIRCUIT DIE WITH LOGICALLY EQUIVALENT BONDING PADS

(75) Inventor: Amir Ronen, Hod Hasharon (IL)

(73) Assignee: SanDisk IL Ltd. (IL)

( * ) Notice: Subject to any disclaimer, the term of this patent is extended or adjusted under 35 U.S.C. 154(b) by 0 days.

(21) Appl. No.: 11/189,764

(22) Filed: Jul. 27, 2005

(65) Prior Publication Data

US 2006/0097284 A1    May 11, 2006

Related U.S. Application Data

(60) Provisional application No. 60/626,311, filed on Nov. 10, 2004.

(51) Int. Cl.
*H01L 27/10* (2006.01)
(52) U.S. Cl. .................................. 257/786; 257/E23.079
(58) Field of Classification Search .................. 257/686, 257/786, E23.079; 326/47, 225
See application file for complete search history.

(56) References Cited

U.S. PATENT DOCUMENTS

| | | | |
|---|---|---|---|
| 4,093,992 A | | 6/1978 | Kawamura |
| 4,703,483 A | * | 10/1987 | Enomoto et al. ............. 714/735 |
| 4,860,087 A | * | 8/1989 | Matsubara et al. ........... 257/786 |
| 5,631,492 A | * | 5/1997 | Ramus et al. .................. 257/532 |
| 5,744,870 A | * | 4/1998 | Casper .......................... 257/786 |
| 5,874,931 A | * | 2/1999 | Drake et al. ..................... 345/51 |
| 5,969,538 A | * | 10/1999 | Whetsel ........................ 324/763 |
| 6,114,878 A | * | 9/2000 | Loughmiller et al. ......... 326/101 |
| 6,232,668 B1 | * | 5/2001 | Hikita et al. .................. 257/777 |
| 6,417,695 B1 | | 7/2002 | Duesman |
| 6,815,807 B2 | * | 11/2004 | Corisis .......................... 257/672 |
| 6,833,620 B1 | * | 12/2004 | Rosefield et al. ............. 257/737 |
| 6,979,905 B2 | | 12/2005 | Nishida et al. |
| 2004/0196682 A1 | * | 10/2004 | Funaba et al. ................ 365/149 |
| 2006/0087013 A1 | | 4/2006 | Hsieh |
| 2006/0097284 A1 | | 5/2006 | Ronen |

* cited by examiner

*Primary Examiner* — Victor A Mandala
*Assistant Examiner* — Krista Soderholm
(74) *Attorney, Agent, or Firm* — Martine Penilla Group, LLP

(57) ABSTRACT

An integrated circuit (IC) die includes two bonding pads, that share a common logical function, such as signal input or signal output, separated by the width of the die, and preferably on opposite sides of the die. System-in-package devices are produced by steps including directly electrically connecting one or the other bonding pad to bonding pads of other, functionally different IC dies, with the bonding pads of the other IC dies, to which are connected bonding pads of common logical function of the IC dies of the present invention, being functionally identical but geometrically different. Multchip package devices are produced by stacking the IC dies of the present invention with other IC dies and directly electrically connecting one or the other bonding pad to different bonding pads of the other IC dies.

14 Claims, 7 Drawing Sheets

US 8,212,367 B2

INTEGRATED CIRCUIT DIE WITH LOGICALLY EQUIVALENT BONDING PADS

This patent application claims the benefit of U.S. Provisional Patent Application No. 60/626,311, filed Nov. 10, 2004

FIELD AND BACKGROUND OF THE INVENTION

The present invention relates to integrated circuits and, more particularly, to an integrated circuit die, two of whose bonding pads, on opposite sides of the die, share a common logical function.

A Multi-Chip Package (MCP) is two or more integrated circuits (ICs), fabricated on respective semiconductor dies such as silicon dies, and packaged in a common package so as to function together as a single "chip". A System In a Package (SIP) is a MCP in which one of the IC dies is a processor die and the other IC die(s) is/are memory dies, for example flash memory dies or Random Access Memory (RAM) dies. Non-SIP MCPs commonly include memory dies of the same or different types. Among the types of memory dies that commonly are packaged together in MCPs are SDRAM dies, SRAM dies, Pseudo RAM (PSRAM) dies, and flash memory dies such as NAND flash dies and NOR flash dies. MCPs and SIPs are commonly used in consumer appliances such as cellular telephone handsets in order to make the appliances compact.

FIG. 1 is a schematic plan view of the internal structure of a MCP 10 with two stacked IC dies 12 and 14. Die 12 is stacked above die 14, which is on a substrate 16. Both dies 12 and 14 include wire bonding pads 18. Bonding pads 18 of die 12 are connected by electrically conducting wire bonds 20 to bonding pads 18 of die 14. Bonding pads 18 of die 14 are connected by electrically conducting wire bonds 22 to pads (not shown) of substrate 16 that are electrically connected to the pins or balls (not shown) of MCP 10. Alternatively, some or all of the bonding pads 18 of dies 12 and 14, that are connected to each other, are connected to each other via pads of substrate 16, with those bonding pads 18 of dies 12 and 14 connected to those pads of substrate 16 by electrically conducting wire bonds. Alternatively, some of the bonding pads 18 of die 12 are electrically connected directly to the pins or balls of MCP 10. All such electrical connections of bonding pads of one die to bonding pads of another die, that are via only electrical conductors such as wire bonds 20 and/or pads of substrate 16, with no electronic components or electronic circuitry intervening, are considered herein to be "direct" electrical connections.

Vendors of MCPs and SIPs commonly purchase their IC dies from a variety of suppliers. Each supplier typically has its own convention for the layout of bonding pads 18, so that a particular bonding pad 18 of die 12 might have to be bonded to a bonding pad 18 of a die 14 from one supplier that is in a different location from the logically equivalent bonding pad 18 of an equivalent die 14 from a different supplier. The need to adapt a die 12 to two dies 14 with different layouts of their bonding pads 18 (or a die 14 to two dies 12 with different layouts of their bonding pads 14) complicates the internal structure of MCP 10 and the process of assembling MCP 10, or alternatively requires the manufacturing of different versions of the same die, with different pad locations.

There is thus a widely recognized need for, and it would be highly advantageous to have, an IC die that is adapted to assembly in a MCP with a variety of other IC dies with different respective layouts of their bonding pads.

SUMMARY OF THE INVENTION

According to the present invention there is provided an integrated circuit die, including a plurality of bonding pads, wherein two of the bonding pads, that share a common logical function, are separated by at least about a width of the integrated circuit die.

According to the present invention there is provided a method of producing system-in-package devices, including the steps of: (a) providing two substantially identical first integrated circuit dies, each first integrated circuit die having a plurality of bonding pads, wherein two of the bonding pads share a common logical function; (b) providing a second integrated circuit die that is functionally different from the first integrated circuit dies, the second integrated circuit die having a plurality of bonding pads; (c) providing a third integrated circuit die that is functionally identical to the second integrated circuit die, the third integrated circuit die having a plurality of bonding pads, the bonding pads of the third integrated circuit die having a different geometric arrangement than the bonding pads of the second integrated circuit die; (d) producing a first system-in-package device by steps including directly electrically connecting a first of the two bonding pads, of one of the first integrated circuit dies, that share the common logical function, to one of the bonding pads of the second integrated circuit die; and (e) producing a second system-in-package device by steps including directly electrically connecting a second of the two bonding pads, of another of the first integrated circuit dies, that share the common logical function, to one of the bonding pads of the third integrated circuit die, wherein the one bonding pad of the third integrated circuit die is functionally identical to but geometrically different than the one bonding pad of the second integrated circuit die.

According to the present invention there is provided a method of producing multichip package devices, including the steps of: (a) providing a plurality of substantially identical first integrated circuit dies, each first integrated circuit die having a plurality of bonding pads, wherein two of the bonding pads share a common logical function; (b) providing a plurality of second integrated circuit dies, each second integrated circuit die having a plurality of bonding pads; (c) producing a first multichip package device by steps including: (i) mounting one of the first integrated circuit dies in a stacked relationship with one of the second integrated circuit dies, and (ii) directly electrically connecting a first of the two bonding pads of the one first integrated circuit die that share the common logical function to a first of the bonding pads of the one second integrated circuit die; and (d) producing a second multichip package device by steps including: (i) mounting another of the first integrated dies in a stacked relationship with another of the second integrated circuit dies, and (ii) directly electrically connecting a second of the two bonding pads of the other first integrated circuit die that share the common logical function to a second of the bonding pads of the other second integrated circuit die.

An integrated circuit die of the present invention includes a plurality of bonding pads, with two of the bonding pads, separated by the width of the die, sharing a common logical function. That the common function is a "logical" function means that the pads are used for a function related to signal processing such as signal input or for signal output, rather than e.g. for power or ground. Note that two pads that share a common logical function can be used independently of each other. Usually, one of the two pads is used and the other is left unused. The "width" of the die is the diameter of the smallest circle that can be inscribed inside the die. In the case of a rectangular die, the "width" of the die is the length of the short sides of the rectangle. Preferably, the two pads that share a common logical function are on opposite sides of the die.

It is known to have two bonding pads in the same IC die with a common logical function. For example, the electronic wristwatch described by Kawamura et al. in U.S. Pat. No. 4,093,992 includes two IC dies 558 and 559 in which both pad 34 and pad 36 are clock signal terminals. It is the conventional wisdom, however, that such bonding pads should be on the same side of their die, as in the case in Kawamura et al., to keep the electrical path between the two bonding pads as short as possible. The innovative aspect of the IC die of the present invention is that in the context of MCPs it sometimes is more convenient to put two bonding pads that share a common logical function on opposite sides of the die, despite the necessarily longer electrical path that connects the two bonding pads.

Preferably, the IC die is rectangular, and the two logical pads that share a common logical function are separated by at least about the length of the short sides of the rectangle. Most preferably, the two pads that share a common logical function are separated by at least about the length of the long sides of the rectangle.

Preferably, the IC die also includes an electronic circuit that is operationally connected to the two bonding pads that share the common logical function. The purpose of the electronic circuit is to implement that common logical function. If the logical function is signal input then the electronic circuit most preferably includes an input buffer. If the logical function is signal output then the electronic circuit most preferably includes an output buffer.

Preferably, the IC die also includes an electrical conductor that directly connects the two bonding pads that share the common logical function.

The scope of the present invention also includes a method of producing SIP devices. The following are provided: two substantially identical first IC dies, a second IC die and a third IC die. The second and third IC dies are functionally identical and are functionally different from the first IC dies. Each first IC die has a plurality of bonding pads, with two of the bonding pads sharing a common logical function. Both the second IC die and the third IC die have respective pluralities of bonding pads, but the bonding pads of the third IC die have a different geometric arrangement than the bonding pads of the second IC die. A first SIP device is produced by steps including directly electrically connecting one of the two bonding pads, of one of the two first IC dies, that share the common logical function, to one of the bonding pads of the second IC die. A second SIP device is produced by steps including directly electrically connecting the other of the two bonding pads, of the other first IC die, that share the common logical function, to one of the bonding pads, of the third IC die, that is functionally identical to but geometrically different from the bonding pad of the second IC die that is used equivalently in the first SIP device. That the bonding pad of the third IC die is "geometrically different" from the bonding pad of the second IC die means that the two bonding pads are at different respective locations on their respective dies.

Preferably, the first IC dies are memory dies and the second and third IC dies are processor dies. Alternatively, the first IC dies are processor dies and the second and third IC dies are memory dies.

The scope of the present invention also includes a method of producing MCP devices. Respective pluralities of first and second IC dies are provided. Each IC die has a plurality of bonding pads. In each first IC die, two of the bonding pads share a common logical function. One MCP is produced by steps including stacking one of the first IC dies above or below one of the second IC dies and directly electrically connecting one of the two bonding pads of the first IC die that share the common logical function to one of the bonding pads of the second IC die. Another MCP is produced by steps including stacking another one of the first IC dies above or below another one of the second IC dies and directly electrically connecting the other of the two bonding pads of the first IC die that share the common logical function to a different one of the bonding pads of the second IC die. The innovative concept of this aspect of the present invention is that although it is obvious to have IC dies such as those taught by Kawamura et al. stacked together with other dies in MCPs, it is not obvious to take advantage of the presence of the two functionally equivalent bonding pads of such IC dies to produce two different kinds of MCPs with different functionalities.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of an IC die which can be packaged conveniently with other IC dies from a variety of suppliers in a MCP. Specifically, the present invention can be used to make SIPs using IC dies, particularly memory dies, obtained from a variety of suppliers.

The principles and operation of an IC die and its use in an MCP according to the present invention may be better understood with reference to the drawings and the accompanying description.

Figure 1:
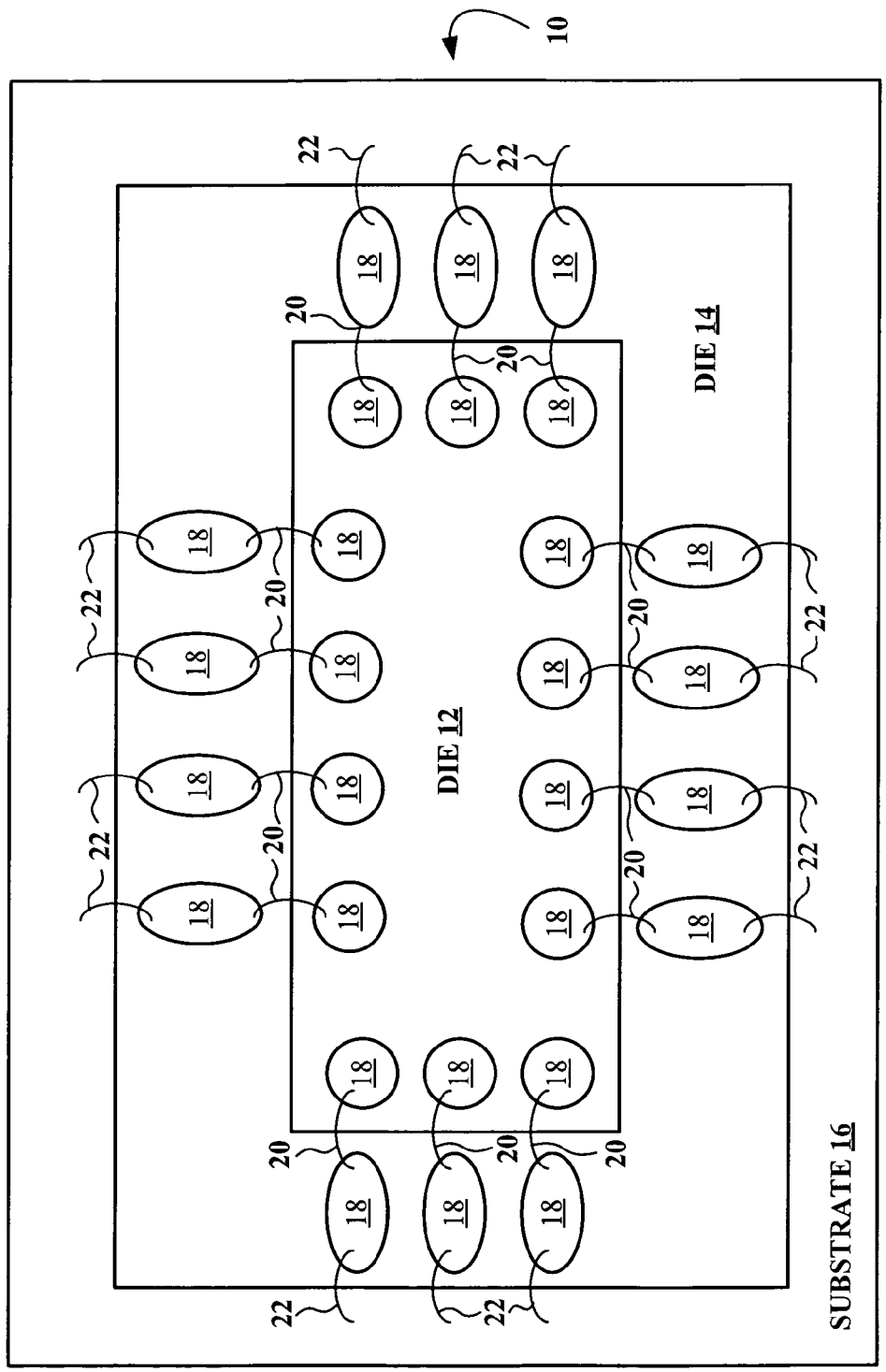
FIG. 1 is a schematic plan view of the internal structure of a typical prior art MCP.
Figure 2A:
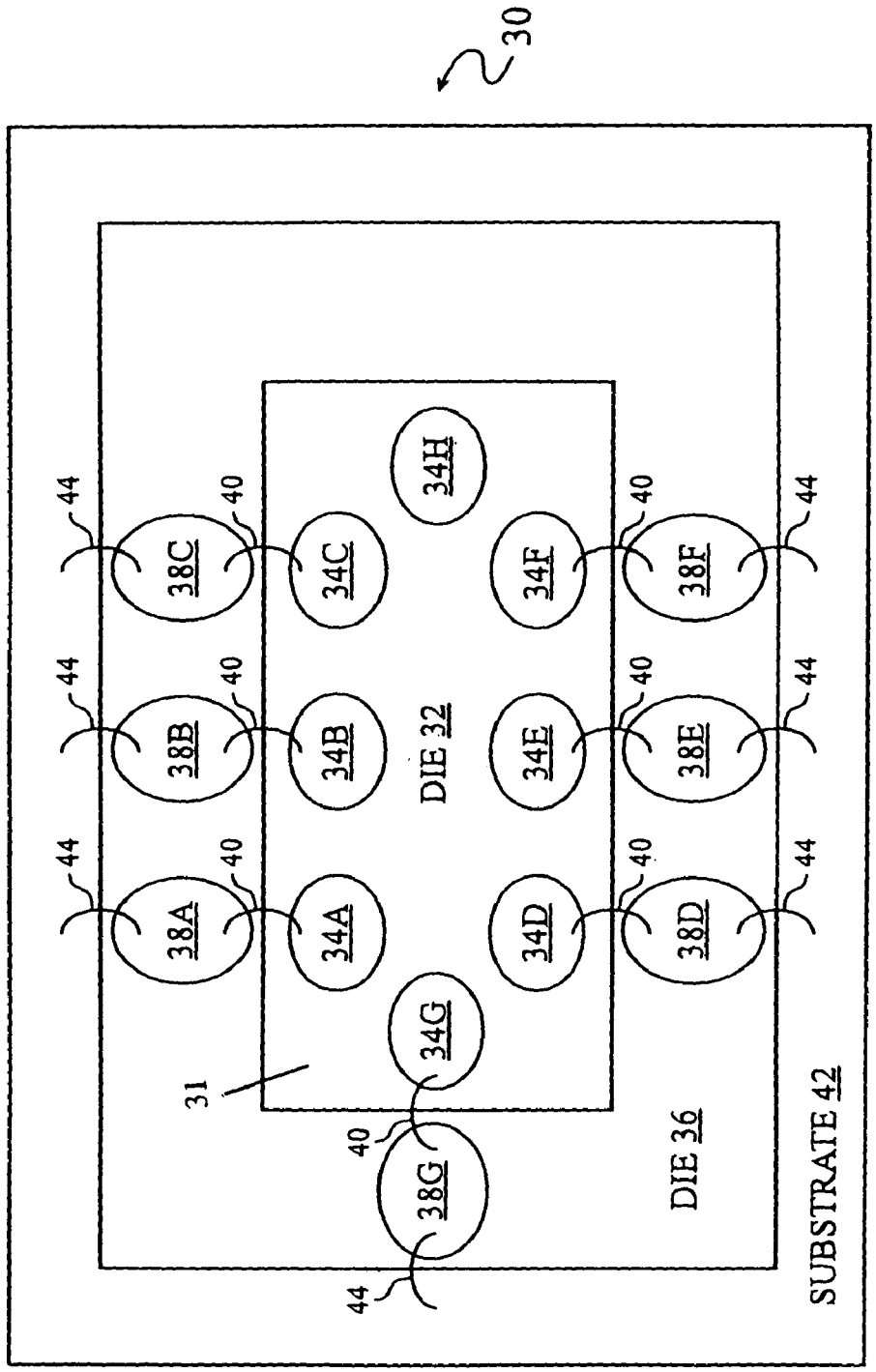
FIGS. 2A and 2B are schematic plan views of two SIPs of the present invention.
Figure 2B:
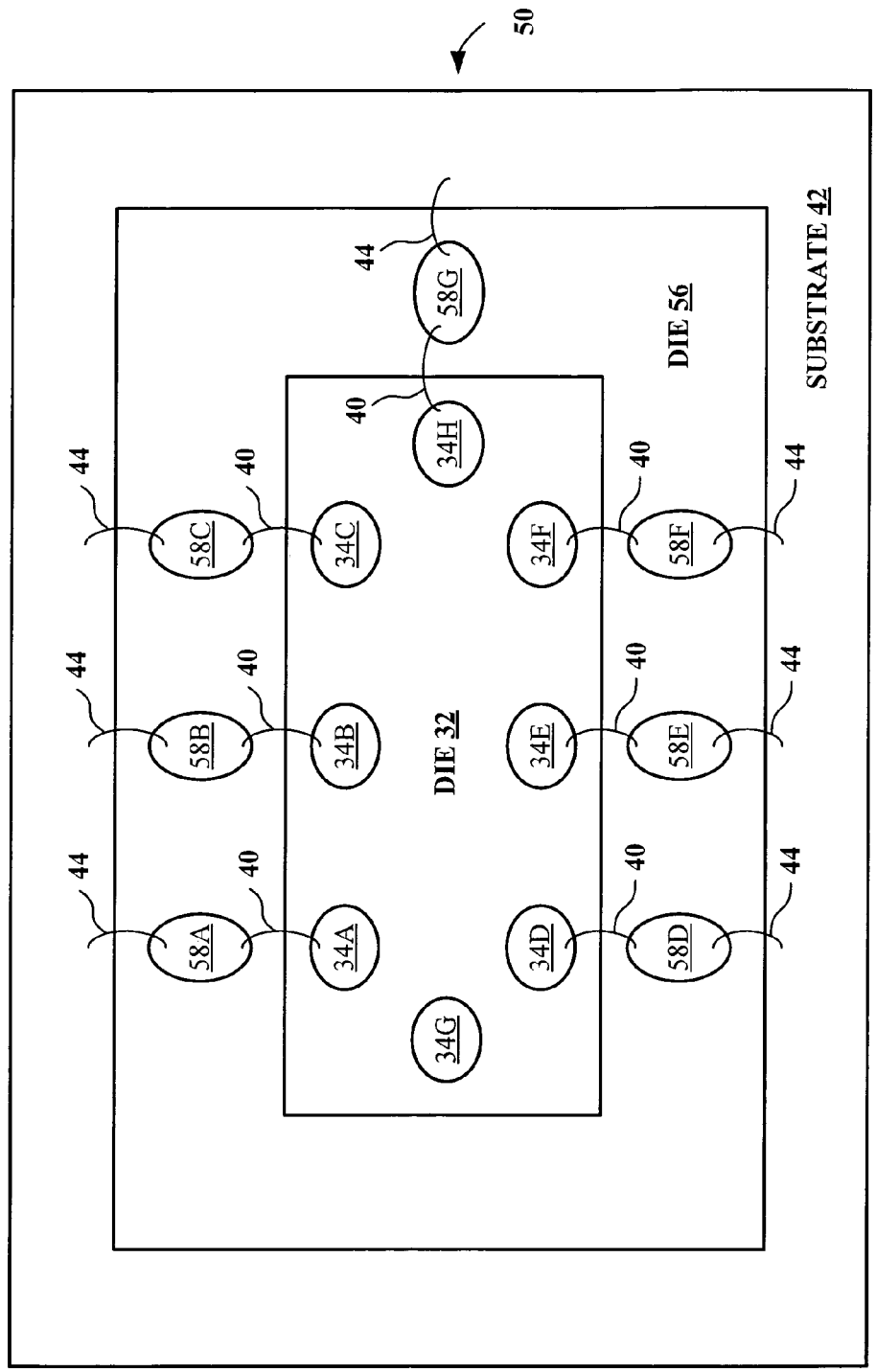

Returning now to the drawings, FIGS. 2A and 2B are schematic plan views of two SIPs 30 and 50 of the present invention. SIPs 30 and 50 include identical flash memory dies 32, with bonding pads 34A-34H. Referring to FIGS. 2A and 2B, bonding pads 34A-34H are distributed on a surface 31 of flash memory dies 32. SIPs 30 and 50 are produced by a manufacturer of flash memory dies 32 who obtains processor dies from various suppliers and packages those processor dies together with the manufacturer's own flash memory dies 32 in SIPs such as SIPs 30 and 50. In SIP 30, memory die 32 is stacked above, and bonded to, a processor die 36, obtained from a first supplier, with bonding pads 38A-38G. In SIP 50, memory die 32 is stacked above, and bonded to, a processor die 56, obtained from a second supplier, with bonding pads 58A-58G. In both cases, the bonding is effected using wire bonds 40. Processor dies 36 and 56, in turn, are bonded to respective substrates 42 using wire bonds 44. Bonding pads 58A-58G have the same logical functionality as bonding pads 38A-38G, but are laid out differently on processor die 56 than on processor die 36. Specifically, although bonding pads 38A-38F and bonding pads 58A-58F have equivalent locations on their respective dies, bonding pads 38G and 58G are on opposite sides of their respective dies. Therefore, bonding pads 34G and 34H, on opposite sides of memory die 32, are given identical logical functions. In SIP 30, bonding pad 34G is bonded to bonding pad 38G. In SIP 50, bonding pad 34H is bonded to bonding pad 58G. The producer of SIPs 30 and 50 is free to obtain processor dies 36 and 56 from two different suppliers.

Figure 3:
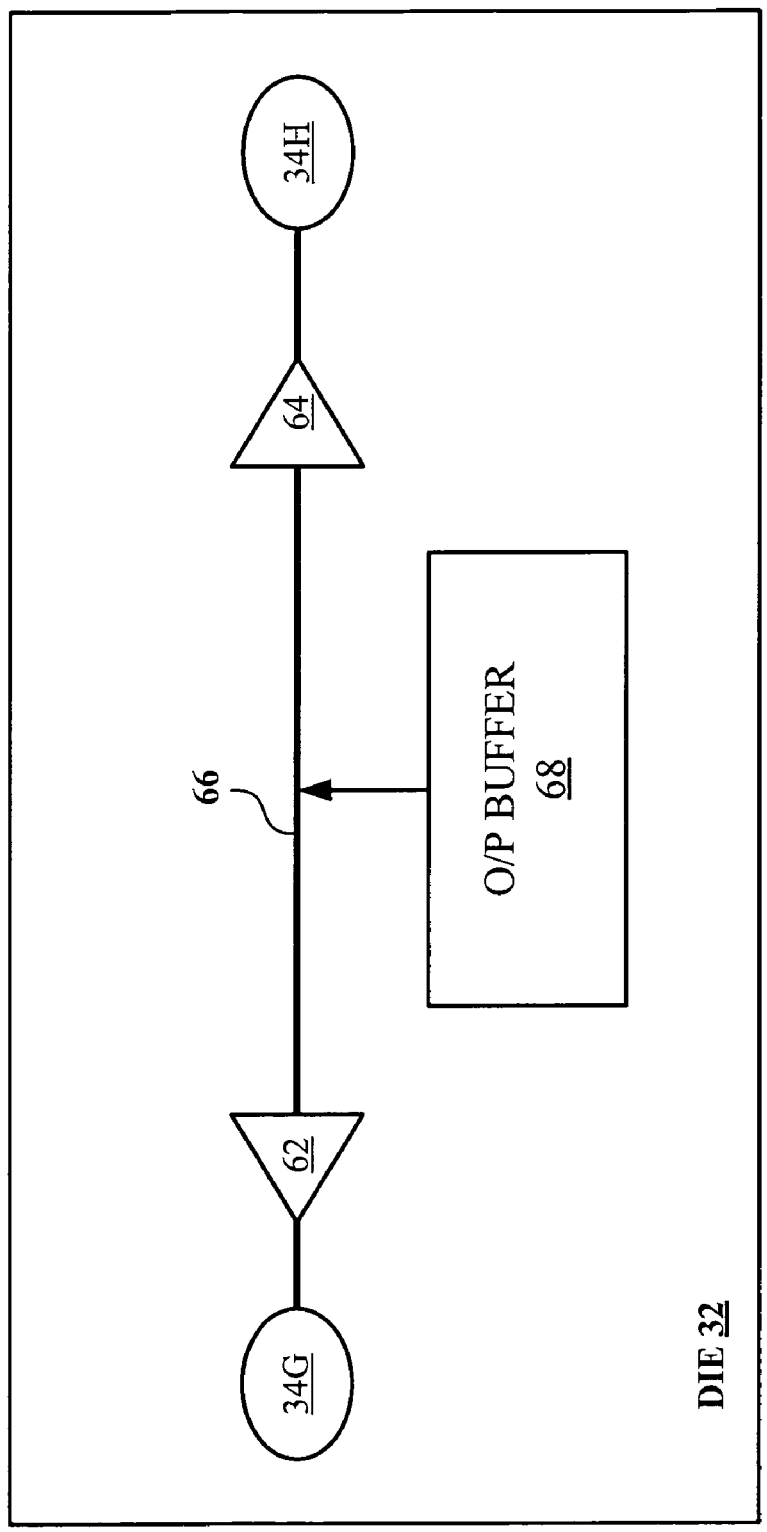
FIG. 3 is a partial schematic diagram of the internal structure of an IC die of the present invention in which the two functionally equivalent bonding pads are used for signal output.

FIG. 3 is a partial schematic diagram of the internal structure of flash memory die 32 in the case that the logical function of bonding pads 34G and 34H is signal output. Bonding pads 34G and 34H are connected, via respective amplifiers 62 and 64 and a common electrical conductor 66, to an output buffer 68 that drives both bonding pads 34G and 34H. Because only one of bonding pads 34G and 34H is used in any specific SIP that includes die 32, the other bonding pad necessarily is dangling. This causes an additional parasitic capacitance, and the internal timing of die 32 is designed accordingly.

Figure 4:
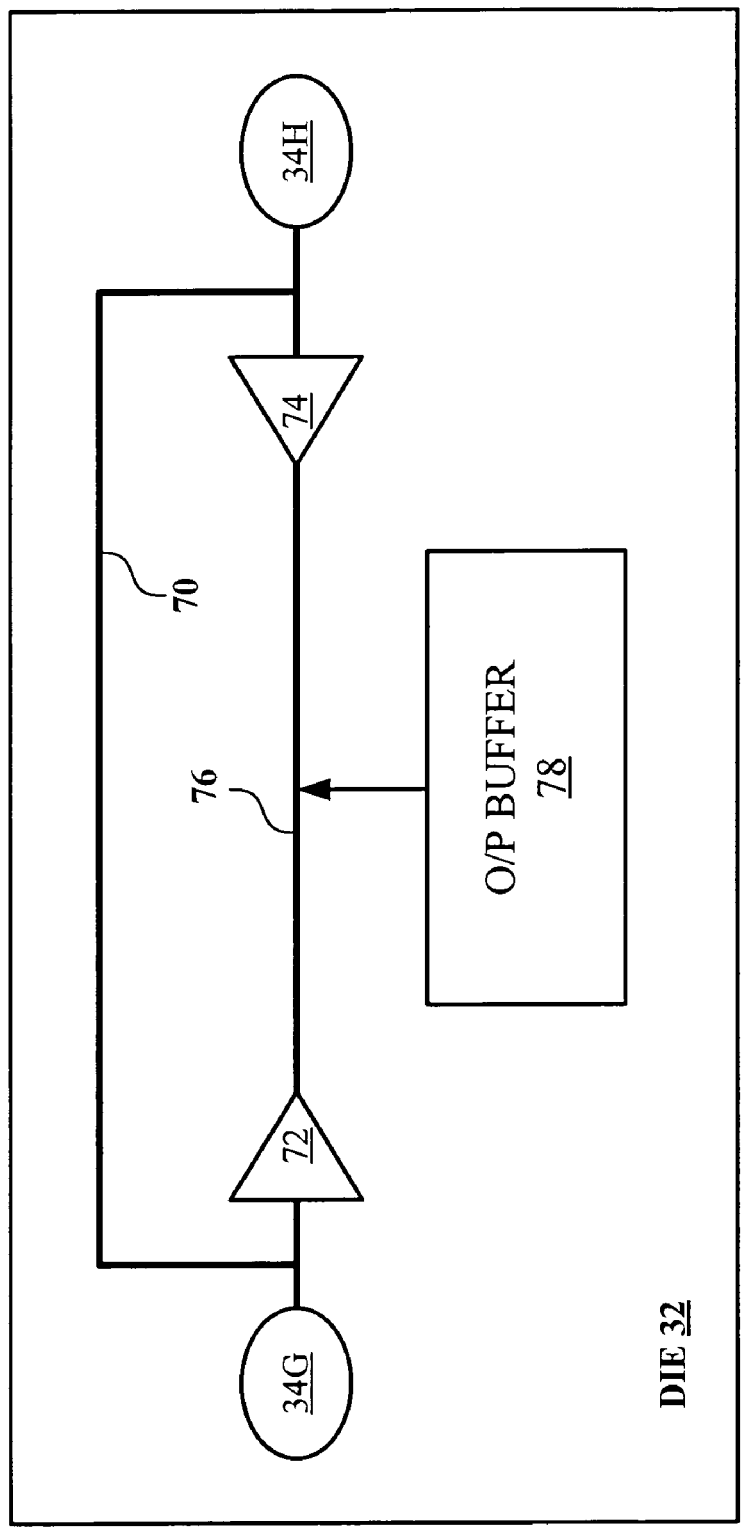
FIG. 4 is a partial schematic diagram of the internal structure of an IC die of the present invention in which the two functionally equivalent bonding pads are used for signal input.

FIG. 4 is a partial schematic diagram of the internal structure of flash memory die 32 in the case that the logical function of bonding pads 34G and 34H is signal input. Bonding pads 34G and 34H are connected via respective amplifiers 72 and 74 and a common electrical conductor 76 to an input buffer 78. In addition, a second electrical conductor 70 shorts bonding pads 34G and 34H so that neither bonding pad is dangling. Without electrical conductor 70, the unused bonding pad 34G or 34H might drive the input driver to the wrong level, thereby creating an electrical contention. Having two bonding pads 34G and 34H increases the parasitic capacitance on the input buffers. The internal timing of die 32 is designed accordingly.

Figure 5A:
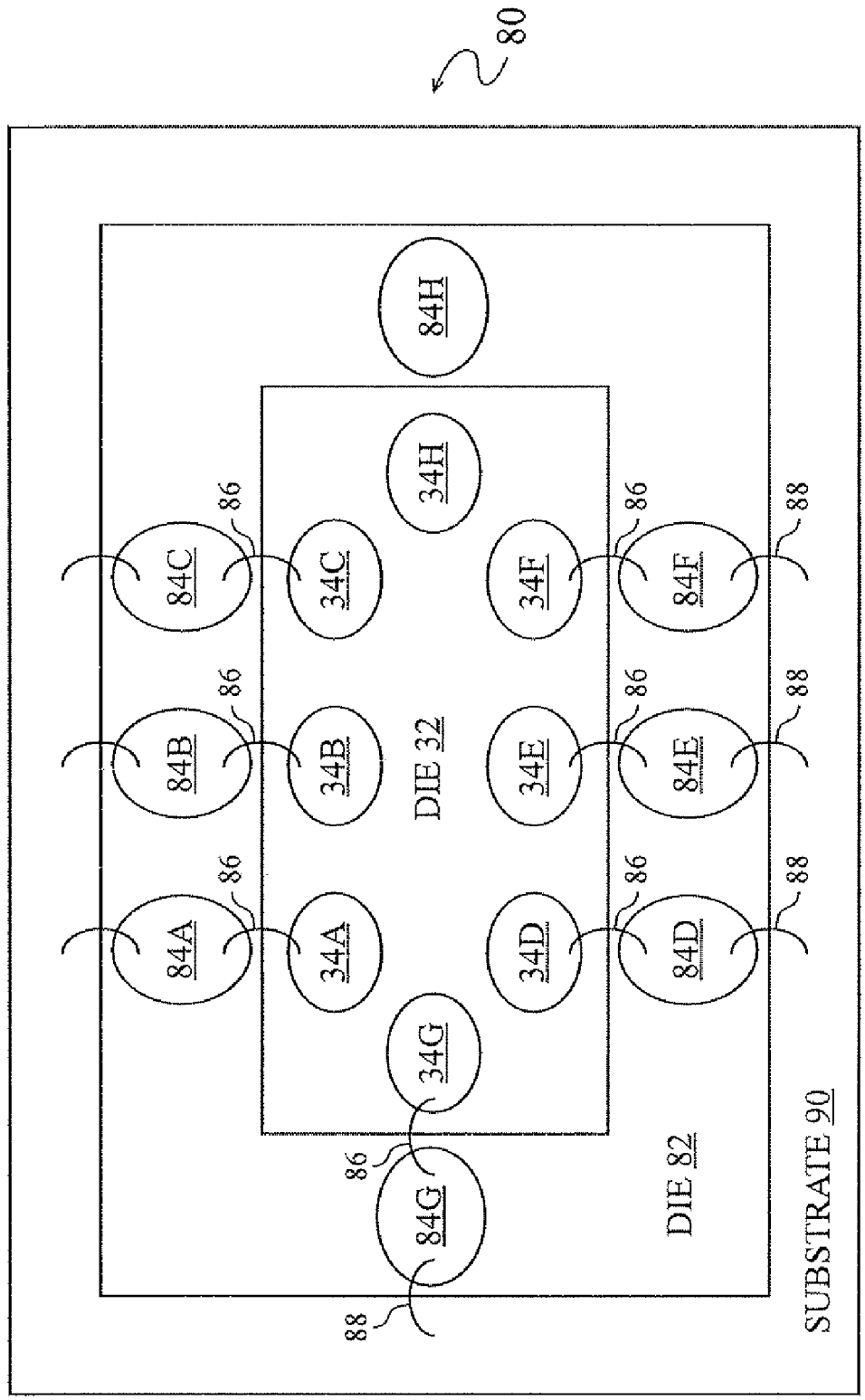
FIGS. 5A and 5B are schematic plan views of two MCPs of the present invention.
Figure 5B:
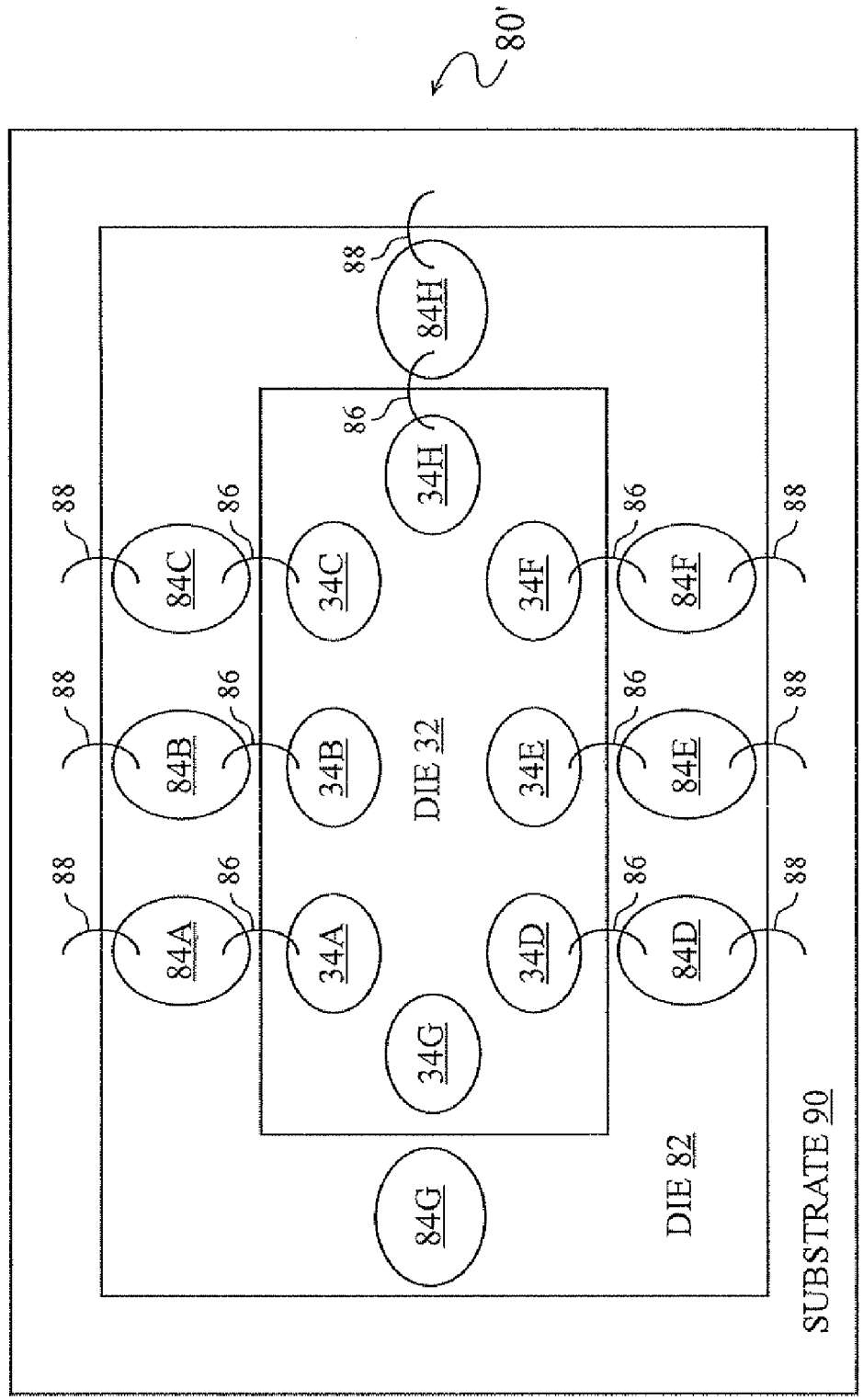

FIGS. 5A and 5B are schematic plan views of two MCPs 80 and 80' of the present invention. MCPs 80 and 80' include identical flash memory dies 32 stacked above and bonded to identical memory dies 82 that could be flash dies but could alternatively be other kinds of memory dies. Each memory die 82 has bonding pads 84A-H. Bonding pads 84G and 84H have similar but not identical functionalities. In both MCPs 80 and 80', bonding pads 34A-34F are bonded to bonding pads 84A-84F using wire bonds 86 and bonding pads 84A-84F are bonded to a substrate 90 using wire bonds 88. In MCP 80, a wire bond 86 is used to bond bonding pad 34G to bonding pad 84G, a wire bond 88 is used to bond bonding pad 84G to substrate 90, and bonding pads 34H and 84H are not used. In MCP 80', a wire bond 86 is used to bond bonding pad 34H to bonding pad 84H, a wire bond 88 is used to bond bonding pad 84H to substrate 90, and bonding pads 34G and 84G are not used. In this way, two different MCPs 80 and 80' with slightly different functionalities are provided using identical components 32 and 82.

While the invention has been described with respect to a limited number of embodiments, it will be appreciated that many variations, modifications and other applications of the invention may be made.

What is claimed is:

1. An integrated circuit die, comprising a plurality of bonding pads, wherein two of said bonding pads, that share a common logical function for a common electrical circuit, are on opposite sides of a same surface of the integrated circuit die, and wherein the remainder of said bonding pads each do not share a logical function with any other of said bonding pads.

2. The integrated circuit die of claim 1, wherein the integrated circuit die is substantially rectangular, with two long sides and two short sides, and wherein said two bonding pads that share said common logical function are separated by at least about a length of said short sides.

3. The integrated circuit die of claim 2, wherein said two bonding pads that share said common logical function are separated by at least about a length of said long sides.

4. The integrated circuit die of claim 1, further comprising an electronic circuit, in said common electrical circuit, that is operationally connected to said two bonding pads that share said common logical function, the electronic circuit being for implementing said logical function.

5. The integrated circuit die of claim 4, wherein said logical function is signal input, and wherein said electronic circuit includes an input buffer.

6. The integrated circuit die of claim 4, wherein said logical function is signal output, and wherein said electronic circuit includes an output buffer.

7. The integrated circuit die of claim 1, further comprising an electrical conductor directly connecting said two bonding pads that share said common logical function.

8. An integrated circuit die, comprising at least three bonding pads, wherein a first and a second said bonding pad share a common first logical function and are on opposite sides of a same surface of the integrated die, and wherein a third said bonding pad has a second logical function different from said first logical function and does not share said second logical function with any other of said bonding pads.

9. The integrated circuit die of claim 8, wherein the integrated circuit die is substantially rectangular, with two long sides and two short sides, and wherein said first and second bonding pads that share said common first logical function are separated by at least about a length of said short sides.

10. The integrated circuit die of claim 9, wherein said first and second bonding pads that share said common first logical function are separated by at least about a length of said long sides.

11. The integrated circuit die of claim 8, further comprising an electronic circuit that is operationally connected to said first and second bonding pads that share said common first logical function, the electronic circuit being for implementing said first logical function.

12. The integrated circuit die of claim 11, wherein said first logical function is signal input, and wherein said electronic circuit includes an input buffer.

13. The integrated circuit die of claim 11, wherein said first logical function is signal output, and wherein said electronic circuit includes an output buffer.

14. The integrated circuit die of claim 8, further comprising an electrical conductor directly connecting said first and second bonding pads that share said common first logical function.

* * * * *